(12) United States Patent
Van Veldhoven

(10) Patent No.: US 8,248,285 B2
(45) Date of Patent: Aug. 21, 2012

(54) MULTI-BIT SIGMA-DELTA MODULATOR WITH REDUCED NUMBER OF BITS IN FEEDBACK PATH

(75) Inventor: Robert Henrikus Margaretha Van Veldhoven, Dommelen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 89 days.

(21) Appl. No.: 12/819,096

(22) Filed: Jun. 18, 2010

(65) Prior Publication Data

US 2011/0012766 A1    Jan. 20, 2011

Related U.S. Application Data

(63) Continuation-in-part of application No. PCT/EP2008/010879, filed on Dec. 16, 2008.

(30) Foreign Application Priority Data

Dec. 19, 2007    (EP) ..................................... 07123562

(51) Int. Cl.
*H03M 3/00* (2006.01)
(52) U.S. Cl. ........................................ 341/143; 341/155
(58) Field of Classification Search .................... 341/143
See application file for complete search history.

(56) References Cited

U.S. PATENT DOCUMENTS

| | | | |
|---|---|---|---|
| 5,329,282 A | 7/1994 | Jackson | |
| 6,313,774 B1 | 11/2001 | Zarubinsky et al. | 341/143 |
| 6,326,912 B1 | 12/2001 | Fujimori | 341/143 |
| 6,404,368 B1 | 6/2002 | Yamaguchi | 341/143 |
| 6,842,129 B1 | 1/2005 | Robinson | 341/143 |
| 6,980,144 B1 * | 12/2005 | Maloberti et al. | 341/143 |
| 7,522,079 B1 * | 4/2009 | Wu | 341/143 |
| 7,825,840 B2 * | 11/2010 | Willig et al. | 341/143 |
| 2002/0180629 A1 | 12/2002 | Liu et al. | 341/143 |
| 2004/0130471 A1 | 7/2004 | Lee | 341/143 |

FOREIGN PATENT DOCUMENTS

| | | |
|---|---|---|
| JP | 2001-156642 A | 6/2001 |
| WO | 02/19533 A2 | 3/2002 |

OTHER PUBLICATIONS

Jiangfeng Wu et al.: "A Simulation Study Electromechanical Delta-Sigma Modulators" ISCAS 2001, Proceedings of the 2001 IEEE International SYmposium on Circuits and Systems, Sydney, Australia, May 6-9, 2001 Bd. vol. 1 of 5, pp. 453-456.*

Japanese Office Action, dated Feb. 21, 2012, corresponding to counterpart Japanese Patent Application No. 2010-538473 (See Foreign Associate provided translation below).

Foreign Associate provided translation of Japanese Office Action, dated Feb. 21, 2012, corresponding to counterpart Japanese Patent Application No. 2010-538473.

* cited by examiner

*Primary Examiner* — Khai M Nguyen

(74) *Attorney, Agent, or Firm* — Potomac Patent Group PLLC

(57) ABSTRACT

A sigma-delta modulator for an ADC, passes an input signal to a loop filter, then to a multi-bit quantizer of the modulator. An output of the quantizer is passed to a digital filter, and a feedback signal is passed back to the loop filter, the feedback signal having fewer bits than are produced by the multi-bit quantizer. The digital filter has an order greater than one in the passband of the sigma-delta modulator.

37 Claims, 5 Drawing Sheets

MULTI-BIT SIGMA-DELTA MODULATOR WITH REDUCED NUMBER OF BITS IN FEEDBACK PATH

BACKGROUND

1. Technical Field

This disclosure relates to sigma-delta modulators, to analog-to-digital converters having a sigma-delta modulator, and to methods of converting a signal.

2. Description of the Related Art

Sigma-delta ($\Sigma\Delta$) modulators are employed in analog-to-digital converters (ADCs). U.S. Pat. No. 6,404,368 discloses in FIG. 3 and its accompanying text a $\Sigma\Delta$ modulator to be used in an over-sampling type ADC, which includes an analog $\Sigma\Delta$ modulator coupled to a digital $\Sigma\Delta$ modulator. The analog $\Sigma\Delta$ modulator includes a digital-to-analog converter (DAC) which converts a one-bit feed-back signal to an analog signal, an analog adder or subtractor which calculates a difference between an output signal transmitted from the DAC and an analog input signal. The analog $\Sigma\Delta$ modulator also has an analog integrator, which integrates output signals transmitted from the analog adder or subtractor, and a first quantizer which converts an output signal transmitted from the analog integrator, into a digital signal. The digital $\Sigma\Delta$ modulator includes a digital adder or subtractor which calculates a difference between an output signal transmitted from the first quantizer and the one-bit feed-back signal, a digital integrator which integrates output signals transmitted from the digital adder or subtractor, a second quantizer which converts an output signal transmitted from the digital integrator into a one-bit digital signal, and a delay element which delays the one-bit digital signal transmitted from the second quantizer and feeds the thus delayed signal back as the one-bit feed-back signal. Since the feedback signal transmitted to the analog modulator is a one-bit signal, distortion caused by non-linearity error of the DAC can be reduced.

BRIEF SUMMARY

In an embodiment of the disclosure there is provided a sigma-delta modulator comprising:

- a summing stage for generating an error signal as the difference between an input signal and a feedback signal;
- a loop filter coupled to an output of the summing stage for filtering the error signal;
- a multi-bit quantizer coupled to an output of the loop filter for quantizing the filtered error signal;
- a digital filter coupled to an output of the multi-bit quantizer; and
- a feedback path coupling an output of the digital filter to the summing stage for providing the feedback signal to the summing stage, wherein the feedback signal has fewer bits than a number of bits produced by the multi-bit quantizer. In an embodiment, there is no other feedback path coupling the output of the digital filter to an input of the digital filter.

In an embodiment of the disclosure there is provided a method of converting a signal comprising:

- generating an error signal as the difference between an input signal and a feedback signal;
- filtering the error signal;
- quantizing the filtered error signal using a multi-bit quantizer;
- filtering the quantized and filtered error signal using a digital filter; and
- generating the feedback signal from an output signal of the digital filter;

wherein the feedback signal has fewer bits than a number of bits produced by the multi-bit quantizer. In an embodiment, there is no other feedback of the output signal of the digital filter to an input of the digital filter.

The use of a multi-bit quantizer helps reduce quantization noise and the feedback having fewer bits helps reduce non-linearity errors, which can arise in the feedback path.

The $\Sigma\Delta$ modulator of the prior art mentioned above has separate feedback loops for the analog $\Sigma\Delta$ modulator and for the digital $\Sigma\Delta$ modulator. In contrast, an embodiment has no feedback path coupling the output of the digital filter to an input of the digital filter other than the feedback path coupling the output of the digital filter to the summing stage. In other words, the $\Sigma\Delta$ modulator of an embodiment may have only a single feedback path, that feedback path being the feedback path coupling the output of the digital filter to the summing stage. This means that there is less or no need for a multiple loop stability analysis. It can therefore be easier to design or adjust the loop filter for stable operation of the $\Sigma\Delta$ modulator, whether the loop filter is arranged as a first order filter or as a higher order filter.

In an embodiment of the disclosure there is provided a sigma-delta modulator comprising:

- a summing stage for generating an error signal as the difference between an input signal and a feedback signal;
- a loop filter coupled to an output of the summing stage for filtering the error signal;
- a multi-bit quantizer coupled to an output of the loop filter for quantizing the filtered error signal;
- a digital filter coupled to an output of the multi-bit quantizer; and
- a feedback path coupling an output of the digital filter to the summing stage for providing the feedback signal to the summing stage, the feedback signal having fewer bits than a number of bits produced by the multi-bit quantizer, wherein the digital filter has an order greater than one in a passband of the sigma-delta modulator.

In an embodiment of the disclosure there is provided a method of converting a signal comprising:

- generating an error signal as the difference between an input signal and a feedback signal;
- filtering the error signal;
- quantizing the filtered error signal using a multi-bit quantizer;
- filtering the quantized and filtered error signal using a digital filter; and
- generating the feedback signal from an output signal of the digital filter, wherein the feedback signal has fewer bits than a number of bits produced by the multi-bit quantizer; and wherein the digital filter has an order greater than one inside a passband of the sigma-delta modulator.

By providing, after the multi-bit quantizer, a digital filter having an order greater than one, the digital filter can have a gain difference between inside and outside of the passband of the $\Sigma\Delta$ modulator sufficient to provide improved suppression of the quantization noise in the feedback signal. Also, the remaining quantization noise can be less correlated with the input signal. This means the remaining noise tends to be less concentrated in the frequencies predominating in the input signal, which means less distortion of the output at the frequencies of interest. This can be applied in a $\Sigma\Delta$ modulator, or in any feedback type modulator where there is a big noise source which can be suppressed by providing gain in front of it.

As noted, the use of a multi-bit quantizer helps reduce quantization noise. The feedback having fewer bits helps reduce non-linearity errors.

An additional feature of some embodiments is the frequency response of the digital filter having a substantially flat gain profile outside of the passband of the sigma-delta modulator. A notable consequence of the flat gain is that there will be little or no effect on the characteristics of the loop filter. This means that there may be little or no need to alter a conventional loop filter to accommodate the digital filter and the feedback signal having fewer bits. This can enable an increase in performance with little or no burden of redesigning and optimizing the loop filter. This can otherwise be a considerable burden, for example in cases where there are multiple adjustments such as filter coefficients, and where it is time consuming to make adjustments without adding instability, or for other reasons. Furthermore, in some cases, costs in redesign, manufacturing and retesting can be saved, or the design of the loop filter can be made simpler or more effective by providing the flat gain characteristic.

An additional feature of some embodiments is the difference in gain of the digital filter inside and outside of the passband of the sigma-delta modulator being greater than or equal to $20 \log_{10}((2^y-1)/(2^z-1))$ dB, where y is the number of bits of the feedback signal and z is the number of bits of the multi-bit quantizer. This can provide improved suppression of quantization noise.

An additional feature of some embodiments is the frequency response of the combination of the loop filter and the digital filter having a first order roll-off of gain outside of the passband of the sigma-delta modulator. This can provide stability of the sigma-delta modulator loop.

In an embodiment, a sigma-delta modulator comprises: a summing stage configured to generate an error signal as a difference between an input signal and a feedback signal; a loop filter coupled to an output of the summing stage and configured to filter the error signal; a multi-bit quantizer coupled to an output of the loop filter and configured to quantize the filtered error signal; a digital filter coupled to an output of the multi-bit quantizer; and a feedback path coupling an output of the digital filter to the summing stage, and configured to provide the feedback signal to the summing stage, the feedback signal having fewer bits than a number of bits produced by the multi-bit quantizer, wherein the digital filter has an order greater than one in a passband of the sigma-delta modulator. In an embodiment, a frequency response of the digital filter has a substantially flat gain outside of the passband of the sigma-delta modulator. In an embodiment, a difference in gain of the digital filter inside and outside of the passband of the sigma-delta modulator is greater than or equal to $20 \log_{10}((2^y-1)/(2^z-1))$ dB, where y is a number of bits of the feedback signal and z is a number of bits produced by the multi-bit quantizer. In an embodiment, a frequency response of a combination of the loop filter and the digital filter has a first order roll-off of gain outside of the passband of the sigma-delta modulator. In an embodiment, the sigma-delta modulator comprises a 1-bit quantizer coupled to the output of the digital filter, the 1-bit quantizer configured to generate the feedback signal as a 1-bit feedback signal. In an embodiment, the 1-bit quantizer is configured to feed back a most significant bit of an output of the digital filter. In an embodiment, the feedback path includes a digital-to-analog converter. In an embodiment, the loop filter comprises at least one of a continuous time filter, a switched capacitor filter, and a digital filter. In an embodiment, the loop filter comprises a filter of order greater than one. In an embodiment, the loop filter comprises an integrator. In an embodiment, the loop filter and the digital filter have a bandpass amplitude response.

In an embodiment, an analog-to-digital converter comprises: a sigma-delta modulator including: a summing stage configured to generate an error signal as a difference between an input signal and a feedback signal; a loop filter coupled to an output of the summing stage and configured to filter the error signal; a multi-bit quantizer coupled to an output of the loop filter and configured to quantize the filtered error signal; a first digital filter coupled to an output of the multi-bit quantizer; and a feedback path coupling an output of the first digital filter to the summing stage, and configured to provide the feedback signal to the summing stage, the feedback signal having fewer bits than a number of bits produced by the multi-bit quantizer, wherein the digital filter has an order greater than one in a passband of the sigma-delta modulator; and a second digital filter coupled to the output of the first digital filter. In an embodiment, a frequency response of the first digital filter has a substantially flat gain outside of the passband of the sigma-delta modulator. In an embodiment, a difference in gain of the first digital filter inside and outside of the passband of the sigma-delta modulator is greater than or equal to $20 \log_{10}((2^y-1)/(2^z-1))$ dB, where y is a number of bits of the feedback signal and z is a number of bits produced by the multi-bit quantizer. In an embodiment, a frequency response of a combination of the loop filter and the first digital filter has a first order roll-off of gain outside of the passband of the sigma-delta modulator. In an embodiment, the analog-to-digital converter comprises a 1-bit quantizer coupled between the output of the first digital filter and an input of the second digital filter, the 1-bit quantizer configured to generate the feedback signal as a 1-bit feedback signal. In an embodiment, the 1-bit quantizer is configured to feed back a most significant bit of an output of the first digital filter. In an embodiment, the feedback path includes a digital-to-analog converter. In an embodiment, the loop filter comprises at least one of a continuous time filter, a switched capacitor filter, and a digital filter. In an embodiment, the loop filter comprises a filter of order greater than one. In an embodiment, the loop filter comprises an integrator. In an embodiment, the loop filter and the first digital filter have a bandpass amplitude response.

In an embodiment, a method of converting a signal using a sigma-delta modulator comprises: generating an error signal as a difference between an input signal and a feedback signal; filtering the error signal; quantizing the filtered error signal using a multi-bit quantizer; filtering the quantized and filtered error signal using a digital filter; and generating the feedback signal based on an output signal of the digital filter, wherein the feedback signal has fewer bits than a number of bits produced by the multi-bit quantizer, and the digital filter has an order greater than one in a passband of the sigma-delta modulator. In an embodiment, generating the feedback signal comprises applying a 1-bit quantization to the output of the digital filter. In an embodiment, applying the 1-bit quantization comprises selecting a most significant bit of the output of the digital filter. In an embodiment, generating the feedback signal comprises converting a digital feedback signal to an analog feedback signal. In an embodiment, filtering the error signal comprises integrating the error signal.

In an embodiment, a system comprises: a sigma-delta modulator, including: means for generating an error signal as a difference between an input signal and a feedback signal; means for filtering the error signal; means for applying a multi-bit quantization to the filtered error signal; means for digitally filtering the quantized and filtered error signal; and means for generating the feedback signal from an output of the means for digitally filtering, wherein the feedback signal has fewer bits than a number of bits produced by the means for applying a multi-bit quantization, and the means for digitally filtering has an order greater than one in a passband of the sigma-delta modulator. In an embodiment, a frequency response of the means for digitally filtering has a substantially flat gain outside of the passband of the sigma-delta modulator. In an embodiment, a difference in gain of the means for digitally filtering inside and outside of the passband of the sigma-delta modulator is greater than or equal to $20 \log_{10}((2^y-1)/(2^z-1))$ dB, where y is a number of bits of the feedback signal and z is a number of bits produced by the multi-bit quantizer. In an embodiment, a frequency response of a combination of the means for filtering the error signal and the means for digitally filtering has a first order roll-off of gain outside of the passband of the sigma-delta modulator. In an embodiment, the means for generating a feedback signal comprises a 1-bit quantizer coupled to the means for digitally filtering, the 1-bit quantizer configured to generate the feedback signal as a 1-bit feedback signal. In an embodiment, the means for generating a feedback signal includes a digital-to-analog converter. In an embodiment, the means for filtering the error signal comprises a filter of order greater than one. In an embodiment, the means for filtering the error signal comprises an integrator. In an embodiment, the means for filtering the error signal and the means for digitally filtering have a bandpass amplitude response. In an embodiment, the system further comprises: a digital filter coupled to the output of the means for digitally filtering.

Any of the additional features can be combined together and combined with any of the aspects. Other advantages will be apparent to those skilled in the art, especially over other prior art. Numerous variations and modifications can be made without departing from the claims. It should be noted that it is not intended to exclude from the signal-delta modulator according to the third aspect of the disclosure, and the method of converting a signal according to the fourth aspect of the disclosure, the possibility of feedback to the digital filter.

BRIEF DESCRIPTION OF THE SEVERAL VIEWS OF THE DRAWINGS

Embodiments are now described, by way of example only, with reference to the accompanying drawings, in which.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, filters and integrators, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The figures are not necessarily reflective of relative proportions and positioning of the structures shown therein.

The headings provided herein are for convenience only and do not interpret the scope or meaning of the embodiments.

By way of introduction to the embodiments, the operation of a known $\Sigma\Delta$ modulator such as can be used for an ADC will be discussed. An ADC using a $\Sigma\Delta$ modulator (which will be termed a $\Sigma\Delta$ ADC) can provide a performance benefit in terms of allowing a high dynamic range of signals to be received for a small amount of power consumption. The power advantage of using such an $\Sigma\Delta$ ADC is maximized if the digital filter following the $\Sigma\Delta$ modulator can be implemented efficiently. The highly over sampled output of a $\Sigma\Delta$ modulator places extra processing burden into the digital domain resulting in increased power consumption. The analog side of the ADC (for example, a 1-bit ADC/DAC and filter) can be relatively simple. The digital side performs filtering and decimation and makes the ADC inexpensive to produce in practice.

Figure 11:
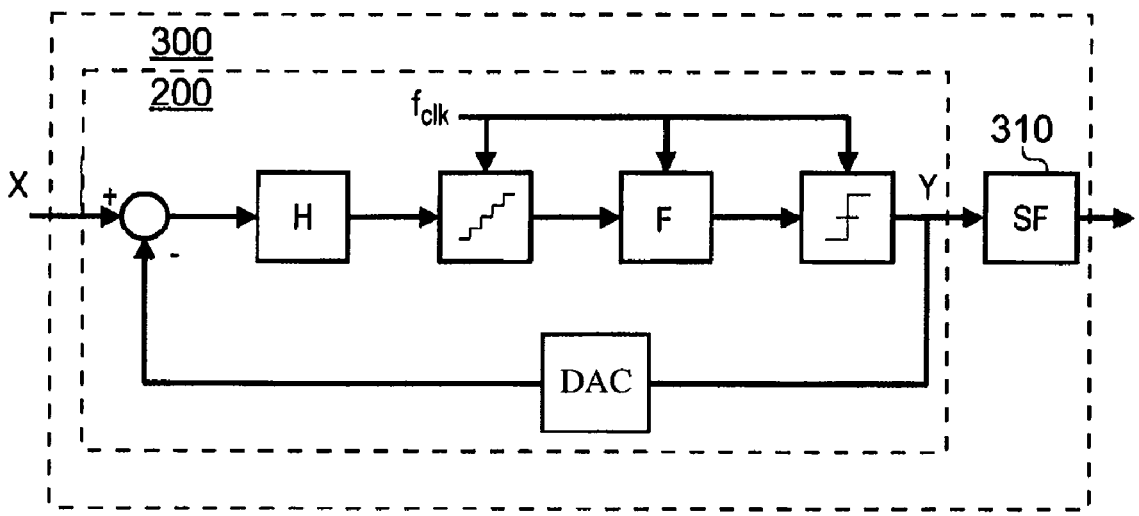
FIG. 11 shows another embodiment, showing a converter having a modulator and an additional digital filter.

The principle of operation of the $\Sigma\Delta$ modulator is well known. In summary, an input analog information signal is fed to a feedback loop comprising a continuous-time analog filter such as an integrator for noise shaping, followed by a quantizer which samples the signal and a feedback path using a DAC. The output signal of the $\Sigma\Delta$ modulator is a stream of bits at a highly oversampled rate. The oversampled bitstream is optionally fed to subsequent digital processing which converts the bitstream to a lower rate representation of the information signal by decimation and digital filtering, to provide a stream of values with more bits, and a lower sample frequency. The oversampling frequency is set to $kf_s$, where $f_s$ is the Nyquist sampling frequency and k is the oversampling ratio. The oversampling causes the noise floor to drop in the same bandwidth. The signal-to-noise ratio (SNR) in the frequency range 0-fs is the same as before, but the noise energy has been spread over a wider frequency range. $\Sigma\Delta$ ADCs exploit this effect by following the 1-bit ADC with a subsequent digital filter. An example of an embodiment having such a subsequent digital filter, SF 310, is shown in FIG. 11, described below. The RMS noise is reduced, because most of the noise is removed by this subsequent digital filter. This action enables ΣΔ ADCs to achieve wide dynamic range from a low-resolution quantizer. By summing an error voltage, which is the difference between the input signal and a feedback signal, the loop filter in the form of an integrator function, acts as a lowpass filter to its input signal. Most of the quantization noise is pushed into higher frequencies where it is removed by digital filtering.

Oversampling and integrating is not directed to changing the total noise power, but its distribution.

The subsequent digital filter can average the 1-bit data stream, improve the ADC resolution, and remove quantization noise that is outside the band of interest. It determines the signal bandwidth, settling time, and stopband rejection. The subsequent digital filter is after the ΣΔ modulator, and should not be confused with the digital filter of the ΣΔ modulator as described below. A comparative example illustrating some features of a ΣΔ modulator 100 is shown for reference purposes in FIG. 1. The ΣΔ modulator 100 comprises an analog input 15 for receiving an input signal X, an analog loop filter 20, a multi-bit quantizer 30 with sample frequency $f_s$, a digital output 17 for providing an output signal Y, a feedback DAC 40 for calculating the analog representation of the quantized signal, and a summing stage 10 for calculating an error signal as the difference between the input signal X and the quantized signal. To the ΣΔ modulator 100 a sample frequency of $f_s = k \times 2 \times f_{BW}$ is applied, where $f_{BW}$ is the signal bandwidth. The oversampling ratio k indicates how many times the sample frequency is higher than the sample frequency defined by Nyquist. In order to have a high signal-to-noise ratio the quantizer 30 should have a high-resolution.

In order to calculate the analog representation of the quantized signal, the DAC 40 should ideally have the same resolution as the quantizer 30. Unfortunately in practice it is difficult to provide such a DAC 40 with sufficient linearity, due to non-linearities in the feedback. DAC 40 quantization noise can fold back into the signal bandwidth, which decreases the maximum signal-to-noise-and-distortion ratio (SDNR). Furthermore non-linearities in the DAC 40 may also cause harmonic distortion of the input signal.

Figure 1:
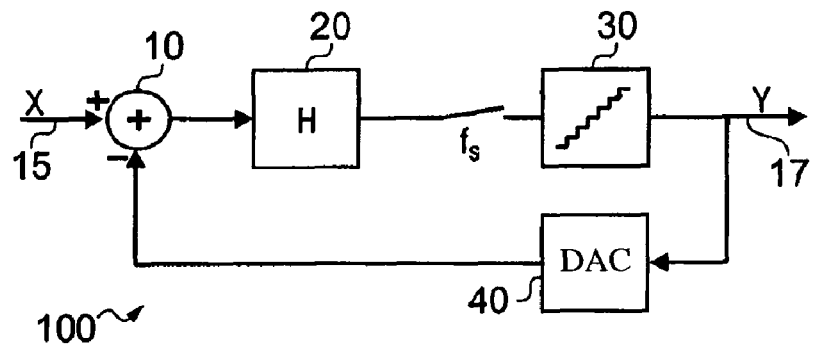
FIG. 1 is a block diagram of a continuous-time $\Sigma\Delta$ modulator.
Figure 2:
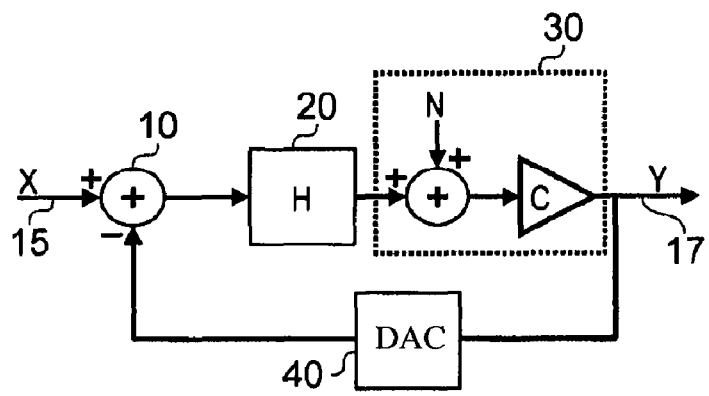
FIG. 2 is a block diagram of a continuous-time $\Sigma\Delta$ modulator in which the quantizer is linearily modeled.

The ΣΔ modulator 100 of FIG. 1 can be modeled with the scheme shown in FIG. 2, where the quantizer 30 is replaced by a quantization noise source having a noise N and a gain C, which represents the gain of the quantizer. From this model the transfer function can be calculated as:

$$Y = \frac{C \cdot H}{1 + C \cdot H} X + \frac{C}{1 + C \cdot H} N \qquad (1)$$

where H is the transfer function of the loop filter 20. For the loop filter 20, a low pass filter implemented with integrators is assumed, which has very high gain for low frequencies and has a certain order roll-off for higher frequencies. At low frequencies the signal X at the input 15 is amplified to the output 17 with a factor of one because of the high gain in the loop filter 20, and the quantization noise is suppressed with this gain. At high frequencies the loop filter 20 has a low gain and the noise rises with the loop filter order. This is an arbitrarily chosen ΣΔ converter. It can be of any order and any number of bits.

Figure 3:
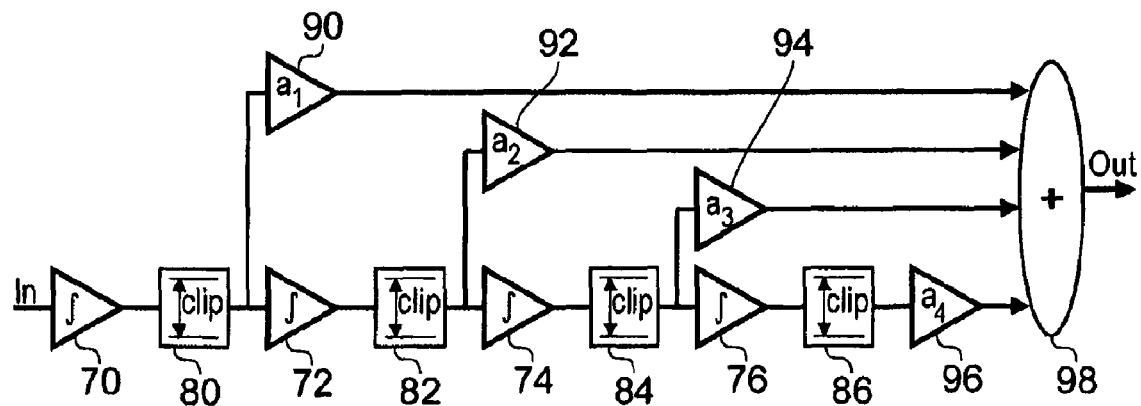
FIG. 3 is a block diagram of an example analog loop filter, for use in the modulator of FIG. 1, or in embodiments.

In FIG. 3, a block diagram of a 4th order loop filter is shown as an example. This can be used in embodiments such as, for example, the embodiment of FIG. 8. It can be implemented using analog circuitry or digital circuitry or combinations thereof. A first integrator 70 is followed by a first clipping circuit 80. An output of the first clipping circuit 80 is amplified by a first amplifier 90 having a gain $a_1$. The output of the first clipping circuit 80 is also fed along a chain of further integrators 72, 74, 76 and clipping circuits 82, 84, 86 coupled in series. At each stage, the output of each clipping circuit 82, 84, 86 is fed to respective amplifiers 92, 94, 96 having respective gains $a_2$, $a_3$ and $a_4$. The outputs of the amplifiers 90, 92, 94, 96 are summed by a summing stage 98 to provide the overall output of the loop filter 20. Filters of other orders can be provided, for example, by altering the number of integrators in the chain.

For high frequencies, the loop transfer function is reduced to first order by the feed-forward gain coefficients $a_2$, $a_3$ and $a_4$ to ensure loop stability. The clip levels are implemented to ensure stability at large amplitude input signals.

Figure 4:
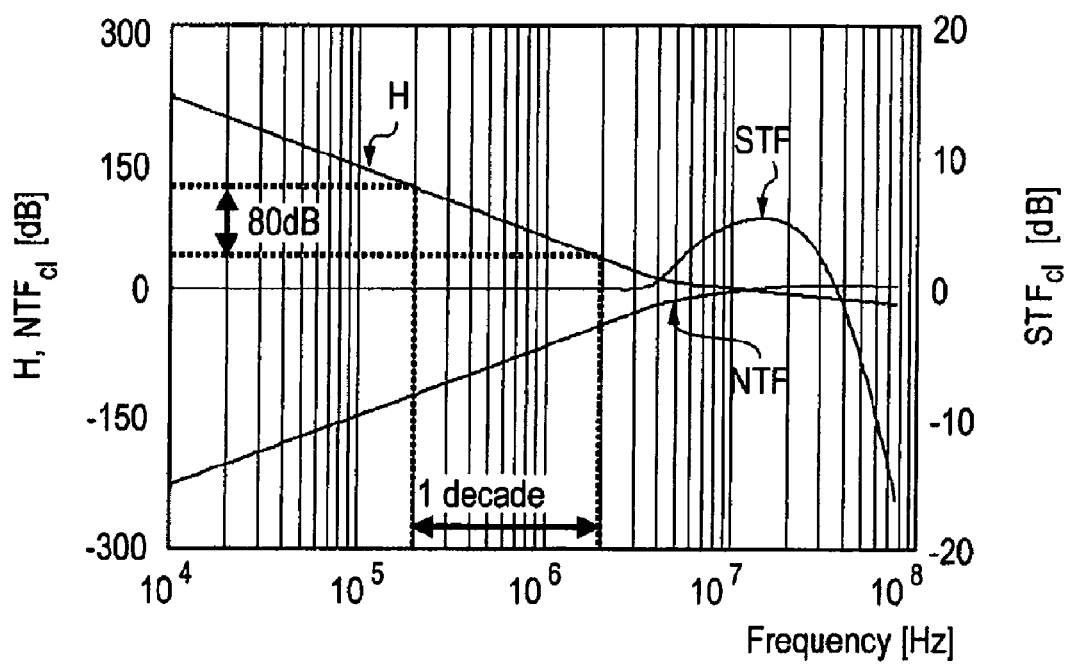
FIG. 4 shows the loop filter transfer function (H), noise transfer function (NTF), and signal transfer function (STF), for the modulator of FIG. 1.

In FIG. 4, the transfer function H of the 4th order loop filter 20 is shown (upper of the three lines) together with the closed loop Signal Transfer Function (STF, middle line of the three lines) and Noise Transfer Function (NTF, lower of the three lines). The STF and NTF are defined below:

$$STF = \frac{Y}{X} = \frac{C \cdot H}{1 + C \cdot H} \qquad (2a)$$

$$NTF = \frac{Y}{N} = \frac{C}{1 + C \cdot H} \qquad (2b)$$

The order of the loop filter can be read from the plot and indeed is 4th order. The noise transfer function rises 4th order with frequency.

In the STF a bump is present, caused by the limited phase margin of the loop filter H. At high frequencies the loop has to return to first order for loop stability, but lowering the return-to-first-order frequency will reduce the suppression of quantization noise in the signal bandwidth, which is unwanted. So a trade-off has to be made between phase margin and suppression of quantization noise.

Figure 5:
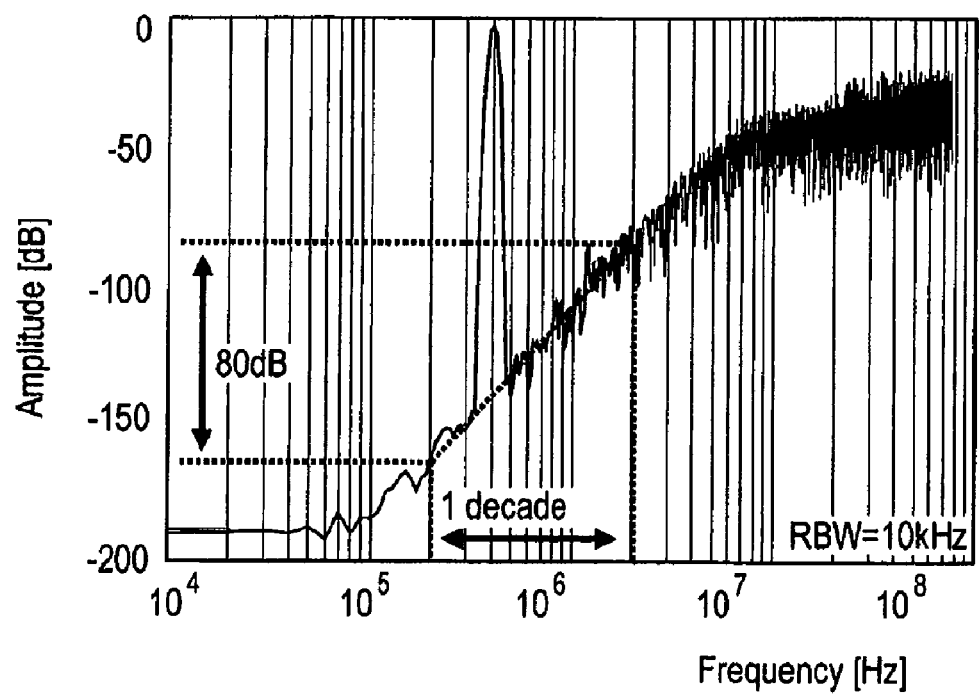
FIG. 5 shows a simulated frequency response of a 4th order $\Sigma\Delta$ modulator using the filter of FIG. 3, with a full scale input signal.

A simulated frequency response of the ΣΔ modulator 100 of FIG. 1 is shown in FIG. 5. The signal-to-noise ratio calculated from the plot is 68 dB in a 2 MHz bandwidth at a sample rate of 153.6 MHz. The 4th order noise shaping can be recognized in the spectrum.

Figure 6:
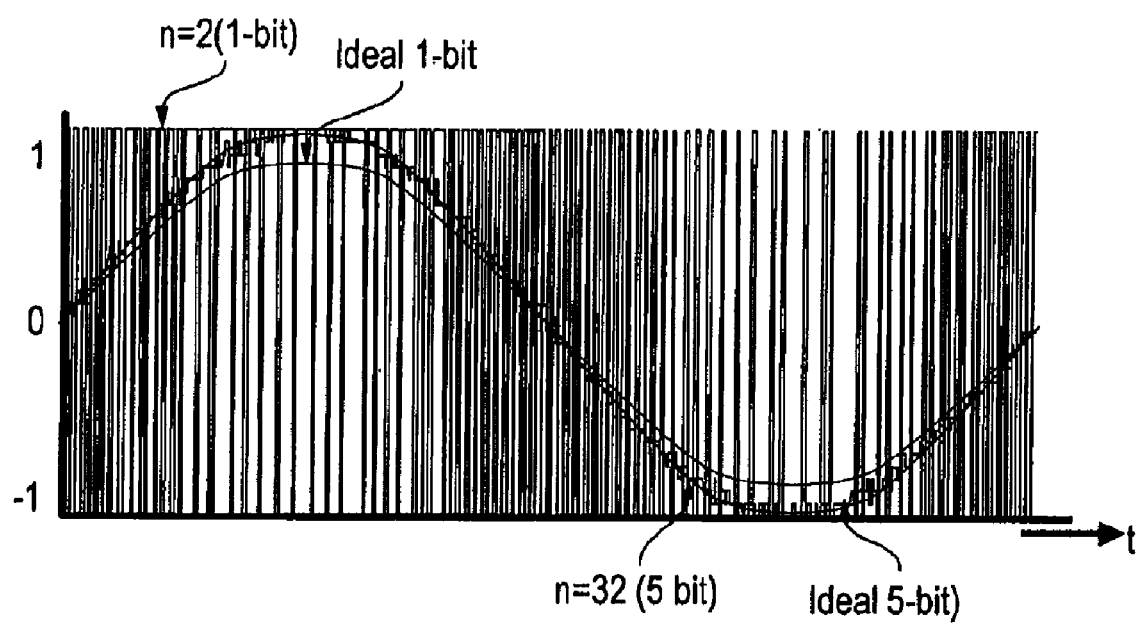
FIG. 6 shows a 1-bit and a 5-bit modulator output signal, as alternatives for comparison.

The quantizer 30 and DAC 40 in a ΣΔ modulator 100 are normally of the same resolution and can be 1-bit or multi-bit. An output bit-stream of a 1-bit and a 5-bit ΣΔ modulator are displayed in FIG. 6, together with an ideal input sine wave, where n is the number of quantization levels, respectively 2 and 32. The 1-bit stream varies between 1 and −1, while the 5-bit stream is close to the ideal, that is the analog sine wave prior to quantization.

When comparing the two bit-streams it is easy to see that the quantization noise is smaller when a multi-bit quantizer and DAC combination is used. The improvement in quantization noise, going from 2 level to a higher number of levels $2^w$, for a w-bit quantizer, can be calculated with the formula below $$\frac{N_{1-bit}}{N_{w-bit}} = 20 \log_{10}(2^w - 1) \qquad (3)$$

This formula indicates an improvement of approximately 6 dB for each bit of a multi-bit quantizer. When comparing the sinewaves in FIG. 6, which indicate the maximum input signal, another thing that can be seen from the bit-streams is that the input amplitude can be larger in a multi-bit modulator when compared to a 1-bit modulator. The maximum signal-to-quantization-noise ratio (SQNR) is given by the following formula:

$$\frac{V_{in,max,w}}{V_{in,max,2}} = 20\log\left(\frac{0.5\sqrt{2} + n - 2}{n-1} \cdot \frac{1}{0.5\sqrt{2}}\right) \quad (4)$$

where $V_{in,max,w}$ is the maximum amplitude of the input signal for a w-bit quantizer, which has $2^w$ quantization levels, and $V_{in,max,2}$ is the maximum amplitude of the input signal for a 1-bit quantizer, which has 2 levels.

Figure 7:
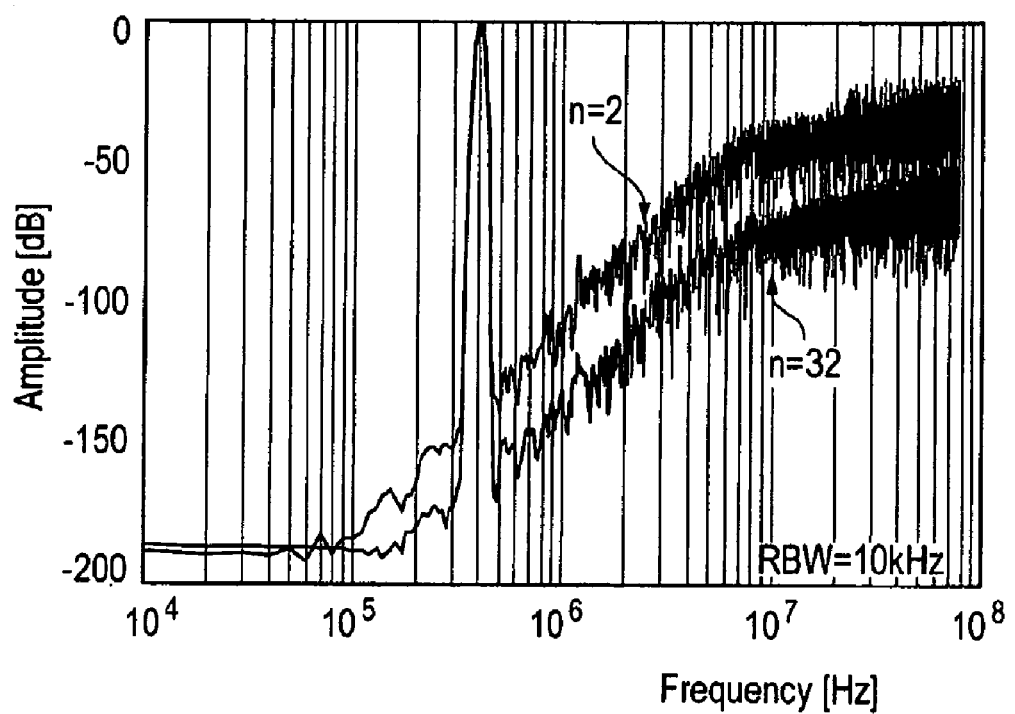
FIG. 7 shows the output spectrum of a 4th order 1-bit and a 4th order 5-bit $\Sigma\Delta$ modulator, as alternatives for comparison.

A simulated noise amplitude of a 1-bit and 5-bit modulator is shown in FIG. 7 for a resolution bandwidth (RBW) of 10 kHz, the lower of the two lines being for the 5-bit modulator, and the upper line being for the 1-bit modulator. From simulation a SQNR of 67.7 dB is derived for the 1-bit modulator and a SQNR of 101.1 dB for the 5-bit modulator.

This is an improvement of about 33 dB when going from 1-bit to 5-bit. A theoretical estimation yields 29.8 dB improvement in SQNR from formula 3 and 2.9 dB from formula 4.

A problem of multi-bit ΣΔ modulators is the linearity in the DAC 40. Due to non-linearities in the feedback DAC 40, quantization noise can fold back into the signal bandwidth, which decreases the maximum achievable SNDR. Furthermore non-linearities in the DAC 40 may also cause harmonic distortion of the input signal.

Static and dynamic non-linearities can occur in the feedback DAC 40. Static non-linearities originate from mismatches in the feedback DAC 40 unit cells. These unit cells, which may be implemented with resistors, capacitors or current sources, are used to create the different output levels in the DAC 40 and when there are mismatches in these unit cells the transfer curve of the DAC 40 will not be a straight line. Based on experience, static DAC linearities of about 60-70 dB are achievable, depending on the implementation of the unit cell. To reduce the static non-linearities in the DAC 40, Dynamic Element Matching (DEM) and Data Weighted Averaging (DWA) techniques can be used, of which the topologies are well known and will not be discussed here. Dependent on their implementation, extra chip area and a higher sample frequency is often needed to facilitate the improvement scheme. Furthermore the improvement in SNDR is only small.

The second non-linearity that occurs in multi-bit modulators is of the dynamic kind. A dynamic non-linearity occurs when switching charges are not the same at every DAC output level, for example due to parasitics. At high speeds this becomes more severe and has to be considered very carefully in circuit design and layout.

A special kind of 1-bit modulator is a 1.5 bit modulator. In this modulator both the quantizer 30 and feedback DAC 40 have three levels (+1, 0, −1). In the middle level, the feedback current is zero, which is easy to implement in circuit design. In 1.5 bit modulators good static linearity of the feedback DAC 40 is rather easy to achieve.

In prior multi-bit ΣΔ modulator solutions, the feedback DAC 40 is also multi-bit, and the dynamic linearity problem can be solved in different ways:

Dynamic Element Matching/Data Weighted Averaging. This class of techniques to linearize the DAC 40 is limited by the order of the loop filter 20, and often needs a higher clock frequency than the sample frequency $f_s$ used for the ΣΔ modulator 100.

Barrel shifting of unit elements. In this technique the unit cells of the DAC 40 are rotated in use, which gives only a small improvement in linearity.

Calibration of current sources. The calibration of current sources improves the linearity of the DAC 40, and linearities up to 14-bit are shown in publications, but this kind of linearizing techniques is quite complicated to design.

The embodiments involve a different approach, but these known approaches, or features of them can also be combined with the different approach of the embodiments described.

The embodiments described relate to apparatus or methods for providing more linear feedback to a multi-bit modulator. In some embodiments a ΣΔ modulator is provided comprising a signal processing chain with successively a loop filter, a w-bit quantizer, a digital filter and a 1-bit quantizer. Some embodiments as will be described below can comprise in addition to the standard noise shaping loop filter 20 and a multi-bit quantizer 30, a digital filter for filtering the output of the multi-bit quantizer 30 and a 1-bit quantizer for quantizing the output of the digital filter and providing the output signal Y and the feedback signal. On the one hand the 1-bit quantizer is inherently linear. On the other hand the presence of the multi-bit quantizer 30 enables part of the loop-filtering to be handled by the digital filter. Alternatively, a further multi-bit quantizer can be used in place of the 1-bit quantizer. The digital filter can have a frequency characteristic which can be shaped more flexibly so as to provide a much better suppression of the noise in the frequency region of interest, without being subject to process imperfections. Where gain is provided by the digital filter, it is not essential that a single filter provides the gain characteristic; instead the digital filter can be implemented as two or more filters in series, such as one to provide the gain in the first frequency band of interest, and another to provide a flat gain at higher frequencies.

Additional features can be as follows. These features are not necessarily essential to all embodiments; they can be omitted or substituted.

The digital filter can have an order greater than one in the passband of the ΣΔ modulator. The gain characteristic of the digital filter outside of the passband of the ΣΔ can have a flat gain profile. The feedback signal can comprise a 1-bit signal. The feedback signal can comprise a most significant bit of an output of the digital filter. The loop filter 20 can comprise any of a continuous time filter, a switched capacitor filter, or a digital filter. In the case of a digital filter, a converter may be used to convert the analog input to a digital signal for input to the digital loop filter 20. The loop filter 20 can comprise a first order or higher order filter. The loop filter 20 can comprise an integrator. The digital filter can have a gain in the passband of the ΣΔ modulator which exceeds the gain outside the passband of the ΣΔ modulator by at least $20 \log_{10}((2^y-1)/(2^z-1))$ dB, where y is the number of bits of the feedback signal and z is the number of bits of the multi-bit quantizer 30. The frequency response of the combination of the loop filter and the digital filter may have a first order roll-off of gain outside of the passband of the sigma-delta modulator. The analog loop filter 20 and digital filter can be implemented as a bandpass filter, yielding a bandpass ΣΔ modulator.

The above mentioned U.S. Pat. No. 6,404,368 document needs stability analysis of multiple loops, while some embodiments may only have one loop. To contrast with U.S.

Pat. No. 6,404,368, a simulation of a ΣΔ ADC in accordance with an embodiment is also described below.

Figure 8:
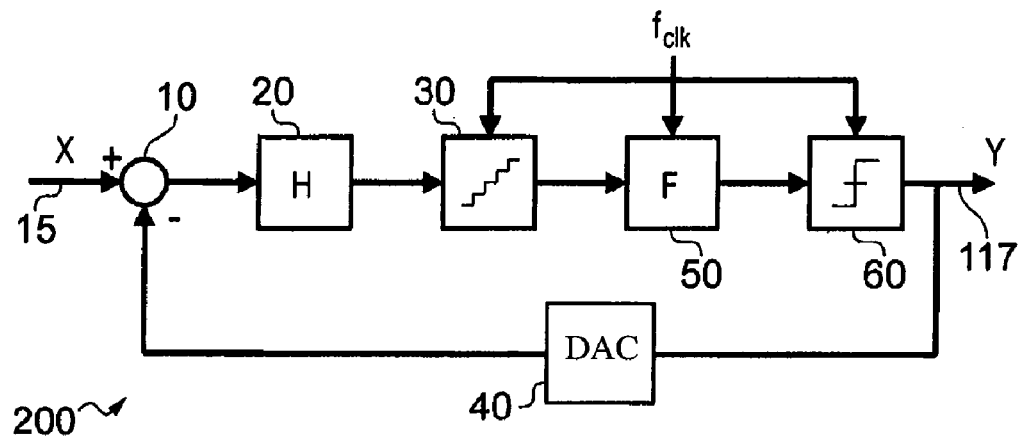
FIG. 8 shows a $\Sigma\Delta$ modulator architecture according to an embodiment.

Referring to the embodiment of the ΣΔ modulator 200 shown in FIG. 8, elements which are identical to those of FIG. 1 have the same reference numerals. The feedback loop contains the loop filter 20 discussed above, the multi-bit quantizer 30, a digital filter 50, and a 1-bit quantizer 60. If we leave out the digital filter 50 and the 1-bit quantizer 60, the loop would be a conventional ΣΔ loop (as in FIG. 1), with the loop filter 20 providing the noise shaping function, and the multi-bit quantizer 30 lowering the quantization noise by 6x dB, where x is the number of bits of the multi-bit quantizer, as discussed above.

The DAC 40 should be linear to avoid high frequency quantization noise folding back into the signal band.

Gain greater than 0 dB in the passband of the ΣΔ modulator 200 may be introduced between the multi-bit quantizer 30 and 1-bit quantizer 60 by the digital filter 50.

The digital filter 50 can suppress the quantization noise introduced by the 1-bit quantizer 60. An output 117 can be taken from after the 1-bit quantizer 60. An alternative to the 1-bit quantizer 60 is to use multiple bits, provided fewer bits are taken than the number of bits provided by the multi-bit quantizer 30 to the digital filter 50. Other elements can be added into the loop to suit particular applications. The ΣΔ modulator presented in FIG. 8 can be linearized, which leads to the model presented in FIG. 9.

Figure 9:
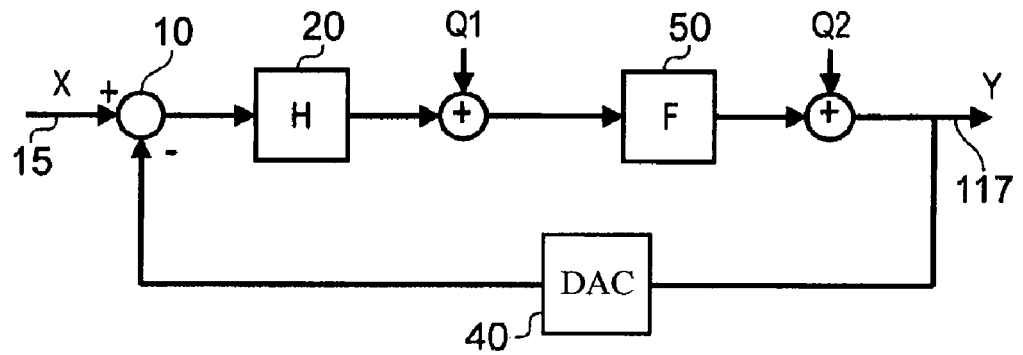
FIG. 9 shows a linearized model of the $\Sigma\Delta$ modulator architecture of FIG. 8.

In FIG. 9, $Q_1$ represents the quantization noise of the multi-bit quantizer 30, and $Q_2$ represents the quantization noise of the 1-bit quantizer 60. The output signal Y at the output 117 can be calculated in terms of the input signal X at the input 15 as:

$$Y = \frac{HF}{1+HF}X + \frac{F}{1+HF}Q_1 + \frac{1}{1+HF}Q_2 \quad (5)$$

where H is the transfer function of the loop filter 20, F is the transfer function of the digital filter 50, $Q_1$ is the quantization noise due to the multi-bit quantizer 30, and $Q_2$ is the quantization noise due to the 1-bit quantizer 60. As can be seen from the formula above, when the loop filter 20 and the digital filter 50 have a high gain in the pass band of the ΣΔ modulator 200, the input signal X is amplified by one to the output signal Y in the passband. $Q_1$ is suppressed by the gain of the loop filter 20, as in a conventional ΣΔ modulator. $Q_2$ is suppressed by the product of H and F, and is even more suppressed compared to $Q_1$, if the digital filter 50 has a high gain in the passband of the ΣΔ modulator 200. Alternatively, the digital filter 50 need not have a high gain provided it has a high gain difference of at least $20 \log_{10}((2^y-1)/(2^z-1))$ dB between the passband and outside of the passband of the ΣΔ modulator. To get the full advantage of the multi-bit quantizer 30, $Q_2$ has to be below $Q_1$, calculated to the output 117. As described above, adding a bit in the multi-bit quantizer 30, would lower quantization noise introduced by the multi-bit quantizer 30 by about 6 dB.

So, compared to the 1-bit quantizer 60, the performance of the ΣΔ modulator 200 would be about 6.z dB better. If an example of a 5-bit quantizer is taken, this would mean that the quantization noise of the 5-bit quantizer when used for the multi-bit quantizer 30 is about 30 dB below that of the 1-bit quantizer 60. This means that the digital filter 50 needs more than about 30 dB of gain in the passband to get $Q_2$ below $Q_1$, to get the full advantage of the multi-bit quantizer 30 together with the 1-bit quantizer 60, which inherently provides a linear feedback path. Alternatively, the digital filter 50 needs at least about 30 dB gain difference between the passband and outside of the passband of the ΣΔ modulator. The figures can be calculated as $20 \log_{10}((2^y-1)/(2^z-1))$ dB.

Figure 10:
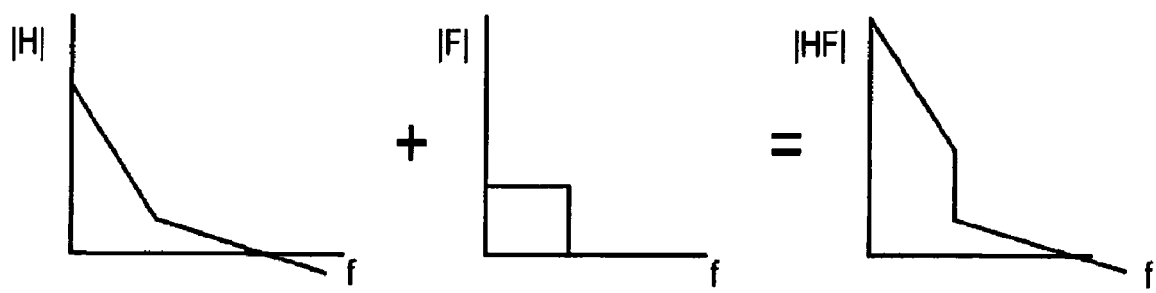
FIG. 10 shows graphs of example filter frequency response characteristics, for use in embodiments.

FIG. 10 shows three graphs of the amplitude of the frequency response. The left graph is an example of the response |H| of loop filter 20; the middle graph shows an example of the response |F| of the digital filter 50; and the right graph shows the combined response |HF| of the loop filter 20 and the digital filter 50. As mentioned above, the digital filter 50 should have high gain, or a high gain difference, in a first band of frequencies, for example in the bandwidth of the input signal X, or equivalently in the passband of the ΣΔ modulator, to suppress the level of the quantization noise $Q_2$ below the level of $Q_1$. The gain at higher frequencies should be lower, preferably by at least $20 \log_{10}((2^y-1)/(2^z-1))$ dB. Another desired feature is that the digital filter 50 should not jeopardize the stability of the loop. Hence in some embodiments, to reduce or avoid instability of the loop, the digital filter 50 should have flat gain outside of the passband of the ΣΔ modulator, in order to avoid excessive phase shift at high frequencies, which can make the loop unstable. If the group delay at high frequencies introduced by the digital filter 50 is kept low, the loop will remain stable with little or no change to the set of gain coefficients in the loop filter 20 compared with the gain coefficients for the loop filter 20 for a conventional ΣΔ modulator 100. Thus, the frequency response of the combination of the loop filter and the digital filter can provide a first order roll-off of gain outside of the passband of the sigma-delta modulator.

From the right-hand graph in FIG. 10 it can be seen that in the signal bandwidth there is more gain compared to the left graph (the difference is |F|). The quantization noise of $Q_2$ will not only be suppressed by the loop filter 20 but also by the digital filter 50. From the same graphs it can be seen that the stability of the ΣΔ modulator 200 remains unchanged, compared with a conventional ΣΔ modulator 100, because the frequency response of the digital filter 50 is flat and does not have excessive phase shift at high frequencies. Because the stability of the loop filter 20 is determined by the feedforward gain coefficients $a_1, a_2, a_3, a_4$ of the analog loop filter 20, no additional feedback paths will be required. This helps make the design of such a ΣΔ modulator much simpler.

In the graphs of FIG. 10, the transition in the frequency response H of the loop filter 20 between a first order response and a higher order response occurs at the same frequency as the bandwidth of the digital filter 50. However this is not an essential requirement, and the transition may occur at a higher or lower frequency.

Advantageously the gain profile of the digital filter 50 should be flat, and not exceed one outside the passband of the digital filter 50. In order to ensure the stability of a feedback loop, typically the first order slope of the gain profile of the filtering in the loop, in this case the combination of the loop filter 20 and the digital filter 50, has to go through 0 dB.

The loop filter 20 of a conventional ΣΔ modulator 100 has this first order slope, so if another slope in the characteristic is added into the loop, it will tend to become unstable. Therefore, by providing the digital filter 50 with a gain profile that is flat, and does not exceed one outside the passband of the digital filter 50, the coefficients of a conventional ΣΔ modulator 100 typically do not need to be altered. Clearly the gain characteristic can be a band pass characteristic, with lower gain at frequencies above and below the signal band.

FIG. 11 shows an embodiment of an analog-to-digital converter 300 employing the ΣΔ modulator 200 shown in FIG. 8. The output signal Y of the ΣΔ modulator 200 is fed to an input of a subsequent digital filter 70 having a transfer function SF.

Figure 12:
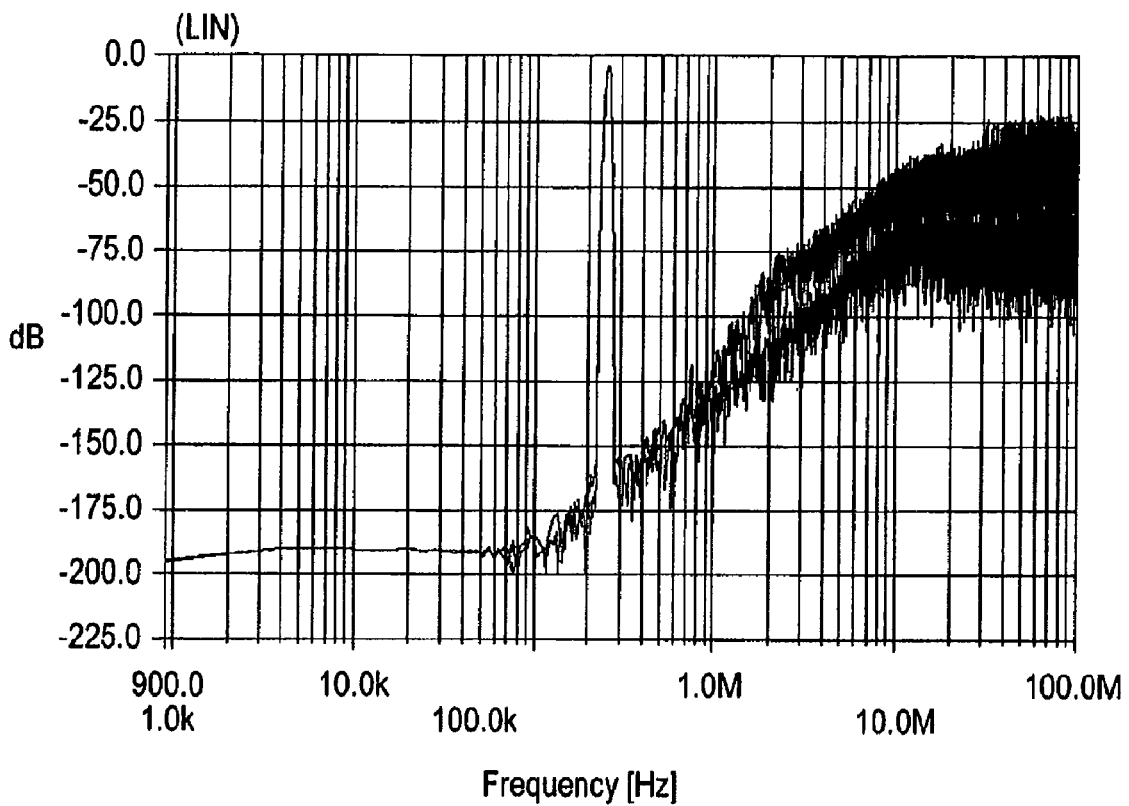
FIG. 12 shows the output spectra of a conventional modulator and of an embodiment, having a 5th order 5-bit $\Sigma\Delta$ modulator.

In FIG. 12, the output spectrum over a range of 100 Hz to 100 MHz on a logarithmic scale, of a conventional 5th order ΣΔ modulator 100 comprising a 5-bit quantizer is shown (lower plot). The figure also shows the output spectrum of the new architecture according to the invention (upper plot), which in this case is also implemented with a 5th order loop filter 20 and a 5-bit quantizer 30. The ΣΔ modulator 200 in this case uses a digital filter 50 which has 30 dB gain in the passband of 500 kHz and 0 dB gain at higher frequencies.

The signal-to-noise ratio (SNR) of the ΣΔ modulator 200 is 134.3 dB, about 4 dB worse compared to the conventional ΣΔ modulator 100 which has a SNR of 138.4 dB. This is due to the gain of the digital filter 50. As indicated above, the gain of the digital filter 50 in the pass band of the ΣΔ modulator 200, or gain difference inband and out-of-band, should be at least $20 \log_{10}((2^y-1)/(2^z-1))$ dB. This is not the case in this example; the gain is 30 dB which is just enough to attenuate $Q_2$ to the same level as $Q_1$, which means the total noise rises by 3 dB compared to the conventional ΣΔ modulator 100. This can be improved by increasing the gain, or inband and out-of-band gain difference, in the digital filter 50. At high frequencies the quantization noise is higher for embodiments compared to the conventional architecture. This is the quantization noise of the 1-bit quantizer because the digital filter 50 has 0 dB gain at high frequencies.

Embodiments can benefit from the fact that there is a multi-bit quantizer 30 in the loop, can benefit from the advantages of a 1-bit inherently linear feedback DAC 40, and can have a higher degree of digitization because a multi-bit DAC which has to be very linear, (therefore needing precision analog parts) is replaced by a digital filter.

An example application in a radio frequency (RF) receiver or other system can have an ADC comprising the ΣΔ modulator 200 and followed by an adaptable digital filter for channel selection or noise removal, or other purpose. A detector determines a level of interference from outside the desired signal band, and feeds this information forward to the adaptable filter. Other analog stages can precede the ADC, and other digital processing stages can follow the adaptable digital filter. There can also be other digital processing stages before the adaptable filter, such as automatic gain control (AGC). The arrangement can form part of a wireless receiver, or can be applied to other systems susceptible to changing interfering signals. The interference information can optionally be fed forward to other subsequent circuit stages such as an equalizer, or a demodulator for example. The amount of processing by these subsequent stages can be adjusted according to the information, to suit different conditions. For example the number of least significant bits used can be changed or a number of filtering stages changed to save power consumption.

Also, optionally the detector can be fed from the analog signal before the ADC. In this case, a relatively simple filter can be implemented in the detector by means of analog components, or the signal can be converted to digital format and a simple digital filter can be implemented with a relatively low number of coefficients and a relatively low update rate.

In a receiver having an adaptable digital filter and a ΣΔ ADC, the adaptable digital filter can combine the decimation function for the ADC and the channel filter function. This can be implemented in an ASIC (application specific integrated circuit) or FPGA (field programmable gate array) type circuit, or can be carried out by a DSP (digital signal processor), as desired. A DSP can be provided for subsequent digital processing such as demodulation, equalization and so on.

The receiver can have an antenna, and conventional analog circuitry such as an RF filter, followed by a mixer for mixing a local oscillator signal LO. An analog low pass filter is followed by the ΣΔ ADC. This feeds a digital signal to the adaptable digital filter, which is adapted according to the unwanted signal information, to adapt the channel filter function to optimize it for power efficiency. The detector can be much simpler than the adaptable digital filter, to save power or reduce complexity. Notably, the adaptation of the digital filter processing can be relatively autonomous, in other words independent of higher levels of software controlling a system or applications using the circuitry, and so need not add complexity to the interface to such software. The detection information can include power levels, averaged levels, frequencies, frequency ranges, comparisons to thresholds, comparisons to wanted parts of the signal, combinations of these and so on.

Another application as an alternative to an ADC is a digital-digital noise shaper. In this embodiment, the arrangement of FIG. 8, or of FIG. 11 can be used, with the loop filter 20 being a digital filter, and the input signal X being a digital signal rather than an analog signal. The quantizer 30 in this case acts as a re-sampler, taking a number of samples at a low quantization level, and outputting a single sample at a higher quantization level. Also, the DAC 40 can be omitted from the feedback path and the summing stage 10 implemented digitally. Other variations and additions can be envisaged within the scope of the claims.

Examples have been described with respect to particular embodiments and with reference to certain drawings but this disclosure is not limited thereto but only by the claims. The drawings described are only schematic and are non-limiting. Where the term "comprising" is used in the present description and claims, it does not exclude other elements or steps. Where an indefinite or definite article is used when referring to a singular noun, e.g., "a" or "an", "the", this includes a plural of that noun unless something else is specifically stated. The term "comprising", used in the claims, should not be interpreted as being restricted to the means listed thereafter; it does not exclude other elements or steps. References to numerical values or ranges are approximate.

Some embodiments may take the form of computer program products. For example, according to one embodiment there is provided a computer readable medium comprising a computer program adapted to perform one or more of the methods described above or to implement one or more of the devices described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The systems, modules and data structures may also be transmitted as generated data signals (e.g., as part of a carrier wave) on a variety of computer-readable transmission mediums, including wireless-based and wired/cable-based mediums.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sigma-delta modulator comprising:
a summing stage configured to generate an error signal as a difference between an input signal and a feedback signal;
a loop filter coupled to an output of the summing stage and configured to filter the error signal;
a multi-bit quantizer coupled to an output of the loop filter and configured to quantize the filtered error signal;
a digital filter coupled to an output of the multi-bit quantizer; and
a feedback path coupling an output of the digital filter to the summing stage, and configured to provide the feedback signal to the summing stage, the feedback signal having fewer bits than a number of bits produced by the multi-bit quantizer, wherein the digital filter has an order greater than one in a passband of the sigma-delta modulator.

2. The sigma-delta modulator of claim 1 wherein a frequency response of the digital filter has a substantially flat gain outside of the passband of the sigma-delta modulator.

3. The sigma-delta modulator of claim 2 wherein a difference in gain of the digital filter inside and outside of the passband of the sigma-delta modulator is greater than or equal to $20 \log_{10}((2^y-1)/(2^z-1))$ dB, where y is a number of bits of the feedback signal and z is a number of bits produced by the multi-bit quantizer.

4. The sigma-delta modulator of claim 1 wherein a frequency response of a combination of the loop filter and the digital filter has a first order roll-off of gain outside of the passband of the sigma-delta modulator.

5. The sigma-delta modulator of claim 1, comprising a 1-bit quantizer coupled to the output of the digital filter, the 1-bit quantizer configured to generate the feedback signal as a 1-bit feedback signal.

6. The sigma-delta modulator of claim 5 wherein the 1-bit quantizer is configured to feed back a most significant bit of an output of the digital filter.

7. The sigma-delta modulator of claim 1 wherein the feedback path includes a digital-to-analog converter.

8. The sigma-delta modulator of claim 1 wherein the loop filter comprises at least one of a continuous time filter, a switched capacitor filter, and a digital filter.

9. The sigma-delta modulator of claim 1 wherein the loop filter comprises a filter of order greater than one.

10. The sigma-delta modulator of claim 1 wherein the loop filter comprises an integrator.

11. The sigma-delta modulator of claim 1 wherein the loop filter and the digital filter have a bandpass amplitude response.

12. An analog-to-digital converter, comprising:
a sigma-delta modulator including:
a summing stage configured to generate an error signal as a difference between an input signal and a feedback signal;
a loop filter coupled to an output of the summing stage and configured to filter the error signal;
a multi-bit quantizer coupled to an output of the loop filter and configured to quantize the filtered error signal;
a first digital filter coupled to an output of the multi-bit quantizer; and
a feedback path coupling an output of the first digital filter to the summing stage, and configured to provide the feedback signal to the summing stage, the feedback signal having fewer bits than a number of bits produced by the multi-bit quantizer, wherein the digital filter has an order greater than one in a passband of the sigma-delta modulator; and
a second digital filter coupled to the output of the first digital filter.

13. The analog-to-digital converter of claim 12 wherein a frequency response of the first digital filter has a substantially flat gain outside of the passband of the sigma-delta modulator.

14. The analog-to-digital converter of claim 13 wherein a difference in gain of the first digital filter inside and outside of the passband of the sigma-delta modulator is greater than or equal to $20 \log_{10}((2^y-1)/(2^z-1))$ dB, where y is a number of bits of the feedback signal and z is a number of bits produced by the multi-bit quantizer.

15. The analog-to-digital converter of claim 12 wherein a frequency response of a combination of the loop filter and the first digital filter has a first order roll-off of gain outside of the passband of the sigma-delta modulator.

16. The analog-to-digital converter of claim 12, comprising a 1-bit quantizer coupled between the output of the first digital filter and an input of the second digital filter, the 1-bit quantizer configured to generate the feedback signal as a 1-bit feedback signal.

17. The analog-to-digital converter of claim 16 wherein the 1-bit quantizer is configured to feed back a most significant bit of an output of the first digital filter.

18. The analog-to-digital converter of claim 12 wherein the feedback path includes a digital-to-analog converter.

19. The analog-to-digital converter of claim 12 wherein the loop filter comprises at least one of a continuous time filter, a switched capacitor filter, and a digital filter.

20. The analog-to-digital converter of claim 12 wherein the loop filter comprises a filter of order greater than one.

21. The analog-to-digital converter of claim 12 wherein the loop filter comprises an integrator.

22. The analog-to-digital converter of claim 12 wherein the loop filter and the first digital filter have a bandpass amplitude response.

23. A method of converting a signal using a sigma-delta modulator, the method comprising:
generating an error signal as a difference between an input signal and a feedback signal;
filtering the error signal;
quantizing the filtered error signal using a multi-bit quantizer;
filtering the quantized and filtered error signal using a digital filter; and generating the feedback signal based on an output signal of the digital filter, wherein the feedback signal has fewer bits than a number of bits produced by the multi-bit quantizer, and the digital filter has an order greater than one in a passband of the sigma-delta modulator.

24. The method of claim 23 wherein generating the feedback signal comprises applying a 1-bit quantization to the output of the digital filter.

25. The method of claim 24 wherein applying the 1-bit quantization comprises selecting a most significant bit of the output of the digital filter.

26. The method of claim 23 wherein generating the feedback signal comprises converting a digital feedback signal to an analog feedback signal.

27. The method of claim 23 wherein filtering the error signal comprises integrating the error signal.

28. A system, comprising:
a sigma-delta modulator, including:
means for generating an error signal as a difference between an input signal and a feedback signal;
means for filtering the error signal;
means for applying a multi-bit quantization to the filtered error signal;
means for digitally filtering the quantized and filtered error signal; and
means for generating the feedback signal from an output of the means for digitally filtering, wherein the feedback signal has fewer bits than a number of bits produced by the means for applying a multi-bit quantization, and the means for digitally filtering has an order greater than one in a passband of the sigma-delta modulator.

29. The system of claim 28 wherein a frequency response of the means for digitally filtering has a substantially flat gain outside of the passband of the sigma-delta modulator.

30. The system of claim 28 wherein a difference in gain of the means for digitally filtering inside and outside of the passband of the sigma-delta modulator is greater than or equal to $20 \log_{10}((2^y-1)/(2^z-1))$ dB, where y is a number of bits of the feedback signal and z is a number of bits produced by the multi-bit quantizer.

31. The system of claim 28 wherein a frequency response of a combination of the means for filtering the error signal and the means for digitally filtering has a first order roll-off of gain outside of the passband of the sigma-delta modulator.

32. The system of claim 28 wherein the means for generating a feedback signal comprises a 1-bit quantizer coupled to the means for digitally filtering, the 1-bit quantizer configured to generate the feedback signal as a 1-bit feedback signal.

33. The system of claim 28 wherein the means for generating a feedback signal includes a digital-to-analog converter.

34. The system of claim 28 wherein the means for filtering the error signal comprises a filter of order greater than one.

35. The system of claim 28 wherein the means for filtering the error signal comprises an integrator.

36. The system of claim 28 wherein the means for filtering the error signal and the means for digitally filtering have a bandpass amplitude response.

37. The system of claim 28, further comprising:
a digital filter coupled to the output of the means for digitally filtering.

* * * * *